US012796180B2

(12) United States Patent
Sim et al.

(10) Patent No.: US 12,796,180 B2
(45) Date of Patent: Nov. 10, 2026

(54) DISPLAY DEVICE AND MANUFACTURING METHOD THEREOF

(71) Applicant: Samsung Display Co., LTD., Yongin-si (KR)

(72) Inventors: Jun Ho Sim, Yongin-si (KR); Kab Jong Seo, Yongin-si (KR); Jae Hun Lee, Yongin-si (KR); Yang-Ho Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 467 days.

(21) Appl. No.: 18/465,163

(22) Filed: Sep. 12, 2023

(65) Prior Publication Data

US 2024/0136475 A1 Apr. 25, 2024
US 2024/0234639 A9 Jul. 11, 2024

(30) Foreign Application Priority Data

Oct. 24, 2022 (KR) ........................ 10-2022-0137368

(51) Int. Cl.
*H10H 20/84* (2025.01)
*H10H 20/01* (2025.01)
*H10W 90/00* (2026.01)

(52) U.S. Cl.
CPC ............ *H10H 20/84* (2025.01); *H10W 90/00* (2026.01); *H10H 20/034* (2025.01); *H10H 20/0362* (2025.01)

(58) Field of Classification Search
CPC ................. H01L 33/44; H01L 25/0753; H01L 2933/0025; H01L 2933/005; H01H 20/034; H01H 20/0362; H01H 2102/3023; H01H 20/84
See application file for complete search history.

(56) References Cited

U.S. PATENT DOCUMENTS 6,398,370 B1 * 6/2002 Chiu ...................... G02B 5/003 428/167
8,395,569 B2 * 3/2013 Min ................... H10K 59/1275 345/82
2005/0140285 A1 * 6/2005 Park ..................... H10K 59/127 313/506

(Continued)

FOREIGN PATENT DOCUMENTS

JP 2004-514167 5/2004
KR 10-2002-0037443 5/2002

(Continued)

*Primary Examiner* — Joseph L Williams
(74) *Attorney, Agent, or Firm* — F. CHAU & ASSOCIATES, LLC

(57) ABSTRACT

A display device includes a light emitting element disposed on a substrate to include an emission layer; and a light controller disposed over the light emitting element, the light controller includes light blocking patterns to extend in a first direction and spaced apart in a second direction intersecting the first direction; and a transmission portion disposed between the light blocking patterns to extend in the first direction, and the transmission portion includes a first transparent organic layer; a transparent inorganic layer disposed on the first transparent organic layer; and a second transparent organic layer disposed on the transparent inorganic layer.

10 Claims, 28 Drawing Sheets

(56) References Cited

U.S. PATENT DOCUMENTS

| | | | |
|---|---|---|---|
| 2010/0271721 A1 | 10/2010 | Gaides et al. | |
| 2014/0306193 A1 | 10/2014 | Lee et al. | |
| 2020/0168844 A1 | 5/2020 | Kim et al. | |
| 2021/0031626 A1 | 2/2021 | Kim et al. | |
| 2021/0036263 A1 | 2/2021 | Kim et al. | |
| 2021/0074770 A1 | 3/2021 | Choe | |
| 2021/0280569 A1 | 9/2021 | You et al. | |
| 2024/0122048 A1* | 4/2024 | Seo | H10K 71/231 |

FOREIGN PATENT DOCUMENTS

| | | | |
|---|---|---|---|
| KR | 10-2003-0048148 | A | 6/2003 |
| KR | 10-0971754 | | 7/2010 |
| KR | 10-2014-0123731 | A | 10/2014 |
| KR | 10-2018-0084333 | | 7/2018 |
| KR | 10-2020-0063591 | A | 6/2020 |
| KR | 10-2021-0016222 | A | 2/2021 |
| KR | 10-2021-0016233 | A | 2/2021 |
| KR | 10-2021-0030538 | A | 3/2021 |
| KR | 10-2021-0092351 | | 7/2021 |
| KR | 10-2021-0113525 | A | 9/2021 |

* cited by examiner

DISPLAY DEVICE AND MANUFACTURING METHOD THEREOF

CROSS-REFERENCE TO RELATED APPLICATION(S)

This application claims priority to and benefits of Korean Patent Application No. 10-2022-0137368 under 35 U.S.C. § 119, filed on Oct. 24, 2022 in the Korean Intellectual Property Office, the entire contents of which are incorporated herein by reference.

BACKGROUND

1. Technical Field

The disclosure relates to an emissive display device and a manufacturing method thereof, and to an emissive display device including a light controller limiting a side viewing angle and a manufacturing method thereof.

2. Description of the Related Art

A display device is a device that displays an image, and may include a liquid crystal display (LCD), an organic light emitting diode (OLED) display, a quantum dot light emitting diode (QLED), a micro LED display, etc.

Such a display device is used in various electronic devices such as a smartphone, a mobile phone, a tablet PC, a monitor, a television, a multimedia player, and a video game console. The display device may be used in various fields other than electronic devices, and research on a display device for a vehicle using an organic light emitting element has recently been conducted.

A light control film (LCF) is provided in a vehicle display device to control a reflected image by blocking light directed to a windshield of a vehicle for safety of a driver.

The above information disclosed in this background section is only for enhancement of understanding of the background of the described technology, and therefore, it may contain information that does not form the prior art that may already be known to a person of ordinary skill in the art.

SUMMARY

Embodiments have been made in an effort to provide a light controller capable of reducing a side emission angle.

The technical objectives to be achieved by the disclosure are not limited to those described herein, and other technical objectives that are not mentioned herein would be clearly understood by a person skilled in the art from the description of the disclosure.

In embodiments, light emitted from a display device used in a vehicle is provided to eyes of a driver so as to not interfere with driving. This is to prevent the display device used in the vehicle from being reflected on a windshield of the vehicle at night to not block a view of the driver.

Embodiments have been made in an effort to limit a side viewing angle of a display device such that privacy of a user is not exposed.

An embodiment provides a display device that may include a light emitting element disposed on a substrate to include an emission layer; and a light controller disposed over the light emitting element, wherein the light controller may include light blocking patterns to extend in a first direction and spaced apart in a second direction intersecting the first direction; and a transmission portion disposed between the light blocking patterns to extend in the first direction. The transmission portion may include a first transparent organic layer; a transparent inorganic layer disposed on the first transparent organic layer; and a second transparent organic layer disposed on the transparent inorganic layer.

A cross-section of the first transparent organic layer may have a substantially forward tapered shape.

The second transparent organic layer may have a substantially quadrangular or a substantially reverse tapered cross-section.

A cross-section of the first transparent organic layer may have a substantially reverse tapered shape, and a cross-section of the second transparent organic layer may have a substantially forward tapered shape.

The transparent inorganic layer may contact an upper surface of the first transparent organic layer and a lower surface of the second transparent organic layer.

The light blocking patterns may have a substantially reverse tapered lower cross-section.

The light blocking patterns may have a substantially diamond or substantially hourglass shape in a cross-sectional view.

The first transparent organic layer may have a height in a range of about 3 μm to about 5 μm in a thickness direction of the substrate.

The transmission portion may have a height in a range of about 6 μm to about 10 μm in a thickness direction of the substrate.

The light blocking patterns may include a light absorbing material having an optical density (OD) in a range of about 1.5 to about 2.0.

An embodiment provides a manufacturing method of a display device, that may include forming a light emitting element on a substrate; forming an encapsulation layer to cover the light emitting element; and forming a light blocking pattern on the light emitting element, wherein the forming of the light blocking pattern may include forming a first transparent organic layer pattern extending in a first direction on the encapsulation layer; forming a transparent inorganic layer pattern to overlap the first transparent organic layer pattern in a plan view; forming a second transparent organic layer pattern to overlap the transparent inorganic layer pattern in a plan view; and applying a light blocking material and filling openings in the first transparent organic layer pattern in the transparent inorganic layer pattern and in the second transparent organic layer pattern with the light blocking material.

The first transparent organic layer pattern may have a substantially forward tapered cross-section.

The second transparent organic layer pattern may have a substantially quadrangular or a substantially reverse tapered cross-section.

A cross-section of the first transparent organic layer pattern may have a substantially reverse tapered shape, and a cross-section of the second transparent organic layer pattern may have a substantially forward tapered shape.

The transparent inorganic layer pattern may contact an upper surface of the first transparent organic layer pattern and a lower surface of the second transparent organic layer pattern.

The light blocking pattern may have a substantially reverse tapered lower cross-section.

The light blocking pattern may have a substantially diamond or substantially hourglass shape in a cross-sectional view.

The first transparent organic layer pattern may be formed to have a height in a range of about 3 μm to about 5 μm in a thickness direction of the substrate.

The light blocking pattern may be formed to have a height in a range of about 6 μm to about 10 μm in a thickness direction of the substrate.

The light blocking pattern may include a light absorbing material having an optical density (OD) in a range of about 1.5 to about 2.0.

According to embodiments, it is possible to provide a display device including a light controller capable of reducing a side emission angle and a manufacturing method thereof.

According to embodiments, the light controller may include a light blocking pattern having an inclined surface formed on a side surface, so that a side reflection angle may be limited.

It is possible to provide a display device including a light controller protecting privacy of a user by limiting a side viewing angle.

Light emitted from the display device used in a vehicle is not provided to a windshield of the vehicle so as to allow the light to not be reflected from the windshield of the vehicle and to not interfere with a view of a driver.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
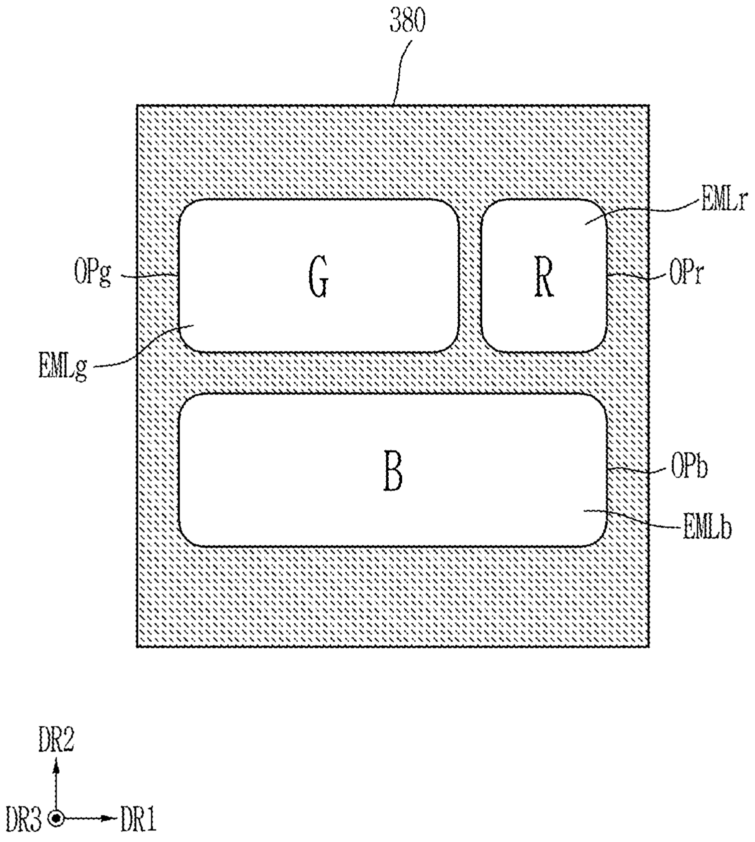
FIG. 1 illustrates a schematic top plan view schematically showing a pixel of a display device according to an embodiment.

The disclosure will be described more fully hereinafter with reference to the accompanying drawings, in which embodiments. As those skilled in the art would realize, the described embodiments may be modified in various different ways, all without departing from the spirit or scope of the disclosure.

To clearly describe the disclosure, parts that may be irrelevant to the description may be omitted, and like numerals refer to like or similar constituent elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

As used herein, the singular forms, “a,” “an,” and “the” are intended to include the plural forms as well, unless the context clearly indicates otherwise.

In the specification and the claims, the term “and/or” is intended to include any combination of the terms “and” and “or” for the purpose of its meaning and interpretation. For example, “A and/or B” may be understood to mean “A, B, or A and B.” The terms “and” and “or” may be used in the conjunctive or disjunctive sense and may be understood to be equivalent to “and/or.”

In the specification and the claims, the phrase “at least one of” is intended to include the meaning of “at least one selected from the group of” for the purpose of its meaning and interpretation. For example, “at least one of A and B” may be understood to mean “A, B, or A and B.”

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, or substrate is referred to as being “on” another element, it can be directly on the other element or intervening elements may also be present. In contrast, when an element is referred to as being “directly on” another element, there are no intervening elements present. Further, in the specification, the word “on” or “above” means disposed on or below the object portion, and does not necessarily mean disposed on the upper side of the object portion based on a gravitational direction.

The terms “overlap” or “overlapped” mean that a first object may be above or below or to a side of a second object, and vice versa. Additionally, the term “overlap” may include layer, stack, face or facing, extending over, covering, or partly covering or any other suitable term as would be appreciated and understood by those of ordinary skill in the art.

When an element is described as ‘not overlapping’ or ‘to not overlap’ another element, this may include that the elements are spaced apart from each other, offset from each other, or set aside from each other or any other suitable term as would be appreciated and understood by those of ordinary skill in the art.

The terms “face” and “facing” mean that a first element may directly or indirectly oppose a second element. In a case in which a third element intervenes between the first and second element, the first and second element may be understood as being indirectly opposed to one another, although still facing each other.

The terms “comprises,” “comprising,” “includes,” and/or “including,”, “has,” “have,” and/or “having,” and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, throughout the specification, the phrase “in a plan view” means when an object portion is viewed from above, and the phrase “in a cross-sectional view” means when a cross-section taken by vertically cutting an object portion is viewed from the side.

In the specification, “connected” means that two or more components are not only directly connected, but two or more components may be connected indirectly through other components, physically connected as well as being electrically connected, or it may be referred to by different names depending on the location or function, but may include connecting each of parts that are substantially integral to each other.

Throughout the specification, when it is said that a portion of a wire, layer, film, region, plate, component, etc., “extends in a first direction or a second direction,” this does not indicate only a straight shape extending straight in the corresponding direction, and indicates a structure that generally extends along the first direction or the second direction, and it includes a structure that is bent at a portion, has a zigzag structure, or extends while including a curved structure.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display device including a light controller according to an embodiment will be described with reference to FIG. 1 to FIG. 4.

Figure 2:
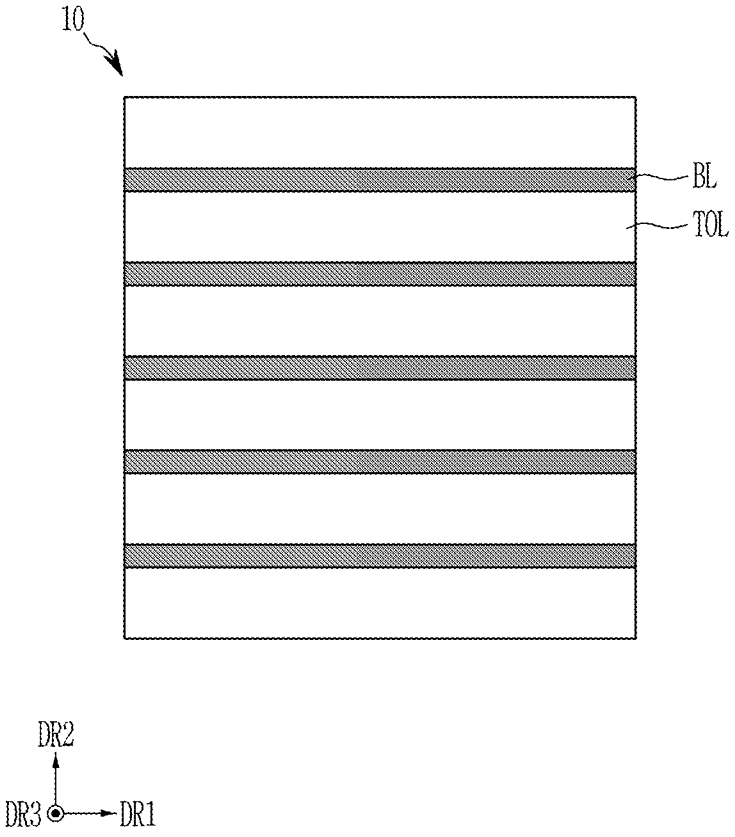
FIG. 2 illustrates a schematic top plan view of a light controller formed in a display device according to an embodiment.
Figure 3:
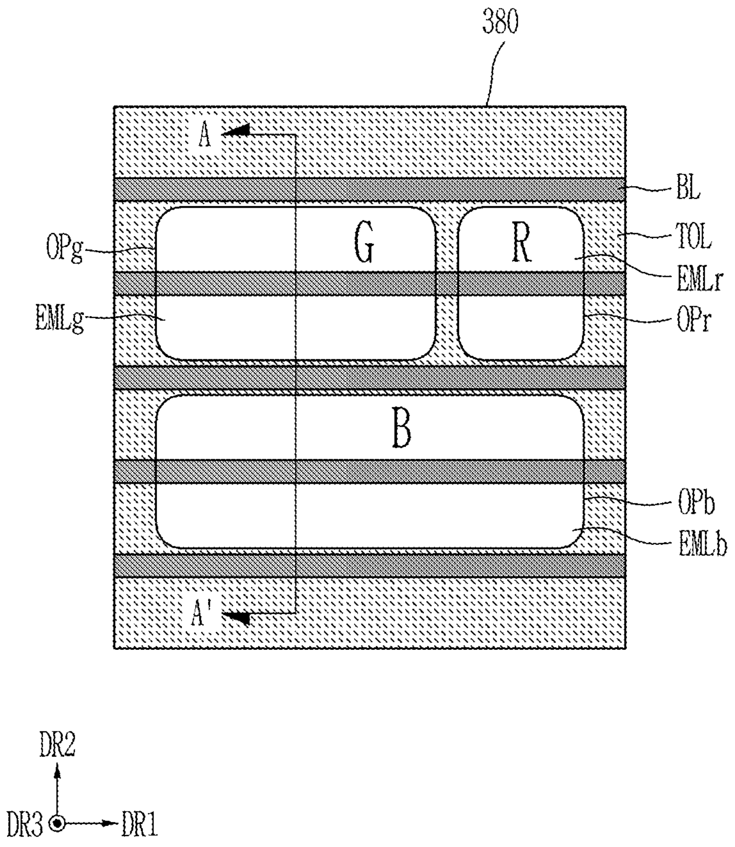
FIG. 3 illustrates a schematic top plan view schematically showing a display device by combining FIG. 1 and FIG. 2.
Figure 4:
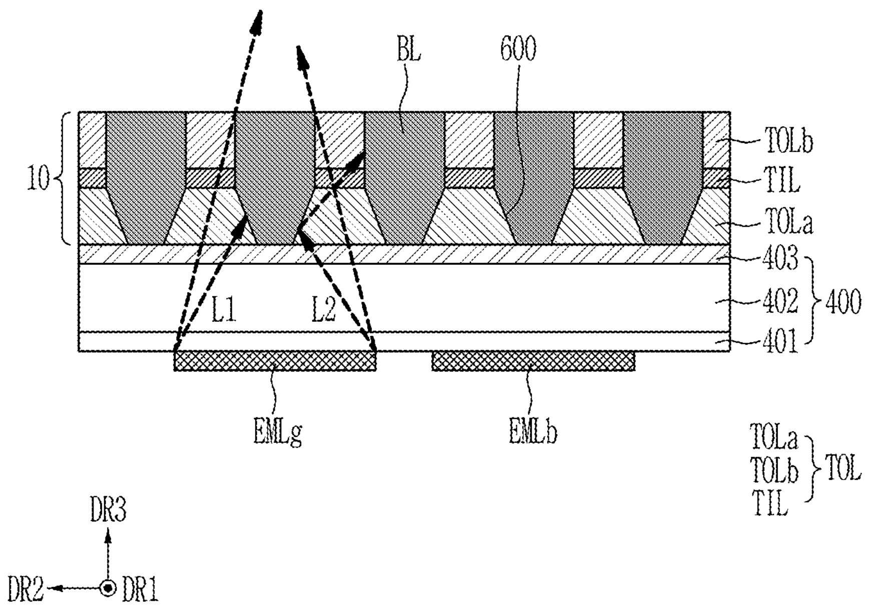
FIG. 4 illustrates a schematic cross-sectional view taken along line A-A' of FIG. 3 according to an embodiment.

FIG. 1 illustrates a schematic top plan view schematically showing a pixel of a display device according to an embodiment, FIG. 2 illustrates a schematic top plan view of a light controller according to an embodiment, FIG. 3 illustrates a schematic top plan view schematically showing a display device by combining FIG. 1 and FIG. 2, and FIG. 4 illustrates a schematic cross-sectional view taken along line A-A' of FIG. 3.

In FIG. 1, three light emitting elements displaying different colors R, G, and B positioned adjacent to each other are briefly illustrated, and each of the light emitting elements may include emission layers EMLr, EMLg, and EMLb.

Each of the emission layers EMLr, EMLg, and EMLb is a light emitting portion of the light emitting element, and is partitioned by the pixel definition layer 380. Each of the emission layers EMLr, EMLg, and EMLb may overlap openings OPr, OPg, and OPb formed in the pixel definition layer 380. The emission layers EMLr, EMLg, and EMLb may be respectively positioned within the openings OPr, OPg, and OPb of the pixel definition layer 380, and may respectively include portions positioned outside the openings OPr, OPg, and OPb. Although not illustrated in FIG. 1, a second electrode (cathode) and an encapsulation layer may be positioned on the pixel definition layer 380 and the emission layers EMLr, EMLg, and EMLb, and a first electrode (anode) may be positioned under or below each of the emission layers EMLr, EMLg, and EMLb. Herein, one anode, one emission layer EMLr, EMLg, or EMLb, and a cathode may constitute one light emitting element. A detailed stacked structure of the light emitting element will be described later with reference to FIG. 22.

FIG. 2 illustrates a planar structure of the light controller 10 according to an embodiment.

The light controller 10 may include light blocking patterns BL. The light blocking patterns BL may include a light absorbing material to limit a viewing angle of a user with respect to image light.

The light blocking patterns BL according to an embodiment may be extended in a first direction DR1, and may be arranged or disposed at regular intervals along a second direction DR2 intersecting the first direction. Intervals between the light blocking patterns BL may not be constant according to an embodiment.

The light blocking patterns BL may include a light blocking material. As the light blocking material, various light absorbing materials used in the art may be used. For example, a dark color pigment such as a black pigment or a gray pigment, a dark color dye, a metal such as aluminum or silver, a metal oxide, or a dark color polymer may be used as the light absorbing material. Examples of the metal oxide may include $MoTaO_x$, $AlO_x$, CrOx, $CuO_x$, $MoO_x$, $Ti_x$, $AlNdO_x$, $CuMoO_x$, and $MoTi_x$.

A transmission portion TOL is positioned in an area where the light blocking patterns BL are not formed. The light controller 10 may have a structure in which a light blocking material is filled in an opening 600 formed in the transmission portion TOL to form the light blocking pattern BL. The transmission portion TOL may transmit light incident from the light emitting element to emit it to the outside, and may include a transparent organic layer and a transparent inorganic layer.

The light controller 10 according to an embodiment may extend in the first direction DR1 in a plan view, may include the light blocking patterns BL disposed at regular intervals along a second direction DR2 intersecting the first direction, and the transmission portion TOL positioned between the light-blocking patterns BL and extending in the first direction DR1, and may be positioned on top of a display panel including a light emitting element as illustrated in FIG. 1.

FIG. 3 illustrates a planar structure of an embodiment in which a light controller as illustrated in FIG. 2 is positioned above a light emitting element including components arranged or disposed as illustrated in FIG. 1.

In FIG. 3, a structure in which one light blocking pattern BL intersects one light emitting element is illustrated, and one light blocking pattern BL is positioned at opposite sides of the light emitting element and also between adjacent light emitting elements.

In an embodiment, the emission layers EMLr, EMLg, and EMLb and/or the openings OPr, OPg, and OPb of the pixel definition layer 380 overlap one light blocking pattern BL, and one light blocking pattern BL is positioned at a center of the emission layers EMLr, EMLg, and EMLb and/or the openings OPr, OPg, and OPb of the pixel definition layer 380. Each of the emission layers EMLr, EMLg, and EMLb and/or the openings OPr, OPg, and OPb of the pixel-defining layer 380 may include a pair of light blocking patterns BL that do not overlap but are positioned adjacent to each other, and the pair of light blocking patterns BL may be positioned to overlap the pixel definition layer 380.

FIG. 4 illustrates a schematic cross-sectional view taken along line A-A' of FIG. 3. Referring to FIG. 4, an encapsulation layer 400 may be positioned below the transmission portion TOL, and may include a lower inorganic encapsulation film 401, an organic encapsulation film 402, and an upper inorganic encapsulation film 403. A light emitting element may be positioned under or below the encapsulation layer 400. In FIG. 4, only the emission layers EMLb and EMLg are briefly illustrated, and a lower structure will be described later with reference to FIG. 22.

According to an embodiment, a touch sensor layer including a touch insulating layer and touch electrodes may be positioned between the transmission portion TOL and the encapsulation layer 400 to sense a touch.

Referring to FIG. 4, a side viewing angle of the display device may be limited by the light blocking pattern BL of the light controller 10.

Referring to FIG. 4, a principle of transmission and blocking of light based on the green emission layer EMLg will be described. The light emitting element emits light from the emission layer EMLg, and the light emitted from the emission layer EMLg may be emitted in various directions. The light emitted in various directions is not transmitted at an angle that is greater than a given angle due to the light blocking pattern BL positioned on top of the emission layer EMLg. For example, light L1 and L2 emitted from the emission layer EMLg may be absorbed by the light blocking pattern BL, so as to not be transmitted to the outside. As a result, a viewing angle of the emissive display device is limited.

In an embodiment, the light controller 10 may include the light blocking patterns BL and the transmission portion TOL on the encapsulation layer 400.

The transmission portion TOL may include a first transparent organic layer TOLa, a second transparent organic layer TOLb, and a transparent inorganic layer TIL positioned therebetween.

A cross-sectional width of the first transparent organic layer TOLa may vary depending on a height in the third direction DR3, which is a thickness direction of the substrate. For example, the first transparent organic layer TOLa may have a wide cross-sectional width at a lower portion close to the emission layer EML and a narrower cross-sectional width toward an upper portion. For example, the first transparent organic layer TOLa may have a forward tapered structure having a trapezoid shape in which a width of a lower portion is wide and the width becomes narrower toward an upper portion in a schematic cross-sectional view.

The transparent inorganic layer TIL may be formed on the first transparent organic layer TOLa. The transparent inorganic layer TIL may be positioned between the first transparent organic layer TOLa and the second transparent organic layer TOLb to serve as an adhesive layer between the upper and lower organic layers. For example, the transparent inorganic layer TIL may be positioned to contact an upper surface of the first transparent organic layer TOLa and a lower surface of the second transparent organic layer TOLb. The inorganic layer TIL is formed by stacking an inorganic material such as a silicon oxide (SiO) and a silicon nitride ($SiN_x$), and according to an embodiment, may be formed of a transparent conductive oxide TCO such as an ITO or an IZO.

A second transparent organic layer TOLb may be positioned on the transparent inorganic layer TIL. For example, the second transparent organic layer TOLb may be formed to have a pillar shape with a constant width. A cross-section of the second transparent organic layer TOLb may have a quadrangular shape.

The first transparent organic layer TOLa and the second transparent organic layer TOLb may each include a transparent resin. For example, it may include an organic material such as a general-purpose polymer such as poly(methyl methacrylate) (PMMA) or polystyrene (PS), a polymer derivative having a phenolic group, an acrylic polymer, an imide polymer such as polyimide (PI), a siloxane polymer, or a cardo polymer.

Light blocking patterns BL filling the opening 600 formed between transmission portions including the first transparent organic layer TOLa, the transparent inorganic layer TIL, and the second transparent organic layer TOLb sequentially stacked from the bottom may be formed. Referring to FIG. 4, since a cross-section of the first transparent organic layer TOLa has a trapezoidal forward tapered shape, the cross-section of the opening 600 formed in the first transparent organic layer TOLa has a reverse tapered shape, and accordingly, the light blocking pattern BL formed in the opening 600 may include a reverse tapered cross-section at a lower portion corresponding to a shape of the opening 600.

As such, according to the forward tapered shape of the first transparent organic layer TOLa, the lower part of the light pattern BL has a side slope of a reverse tapered shape, and a side emission angle may be reduced by limiting a reflection angle of light L2 that is not partially absorbed and is reflected from a side surface of the light blocking pattern BL. An emission angle will be described in detail with a comparative example in FIGS. 21A, 21B, 21C, and 21D.

Figure 5:
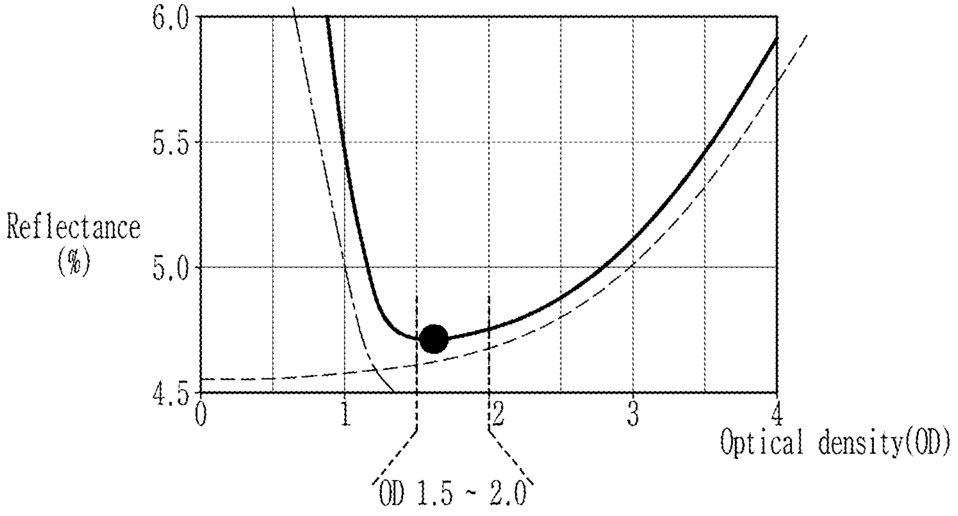
FIG. 5 illustrates a graph showing a relationship between optical density (OD) and reflectance (%) of a light absorbing material.

FIG. 5 illustrates a graph showing reflectance (%) according to optical density (OD) of a light absorbing material.

As a light absorbing material included in the light blocking pattern BL, a dark-colored pigment such as a black or gray pigment, a dark-colored dye, a metal such as aluminum or silver, a metal oxide, and a dark-colored polymer may be used, and light reflectance of the light blocking pattern BL may vary depending on an optical density (OD) of the material.

Referring to FIG. 5, the reflectance rapidly decreases as the optical density (OD) of the material increases, and increases again as the optical density (OD) passes 1.5. Thereafter, as the optical density (OD) passes 2.0, the reflectance increases rapidly again, and thus it can be seen that the optimal optical density (OD) for lowering the light reflectance of the light absorbing material is formed in a range of about 1.5 to 2.0. Therefore, according to an embodiment, the optical density (OD) of the light absorbing material included in the light blocking pattern BL may be in a range of about 1.5 to 2.0. The optical density (OD) of the light blocking pattern BL may be controlled by an amount of pigment and a thickness of the light blocking pattern BL.

Hereinafter, a manufacturing method of the light controller 10 according to an embodiment will be described through FIG. 6 to FIG. 10. FIG. 6 to FIG. 10 illustrate a manufacturing method of forming the light controller 10 of the display device according to an embodiment.

FIG. 6 to FIG. 10 illustrate some or a number of the layers positioned under or below the light controller 10, and only the upper inorganic encapsulation film 403 included in the encapsulation layer 400 is illustrated.

Figure 6:
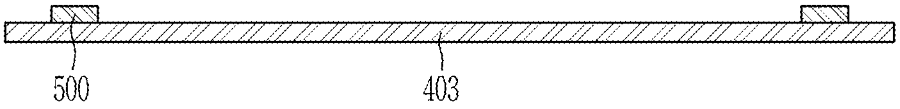
FIG. 6 to FIG. 10 illustrate a manufacturing method of forming a light controller according to an embodiment.

Referring to FIG. 6, an align key 500 is formed on the upper inorganic encapsulation film 403. The align key 500 may be used for pattern alignment in a following process. The align key 500 may be formed by a printing process or a photolithography process. For example, in the printing process, a roll printing, imprinting, screen printing, gravure printing, gravure-offset printing, or flexographic printing method may be used. The photolithography process may be performed through an etching process in which a photoresist pattern is formed by exposure and development using a mask and is etched. The etching process may be a wet etching process, a dry etching process, or a laser scribing process.

Figure 7:
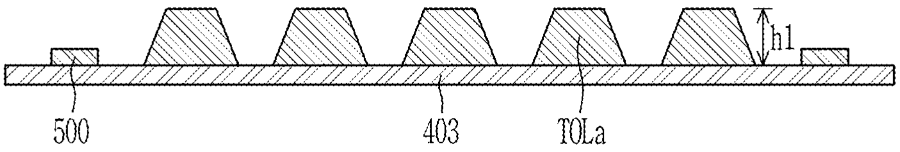

Subsequently, referring to FIG. 7, a pattern of the first transparent organic layer TOLa is formed by applying a transparent organic material on the upper inorganic encapsulation film 403 and patterning a transparent organic material using the photolithography process.

The first transparent organic layer TOLa may be formed to extend in one direction or a direction, and may have a first height h1 in the third direction DR3, which is a thickness direction of the substrate. For example, the first height h1 of the first transparent organic layer TOLa may be in a range of about 3 μm to about 5 μm.

The first transparent organic layer TOLa may be formed to have a forward tapered shape in which a width decreases toward the top in a schematic cross-sectional view. During the photolithography process, exposure of the first transparent organic layer TOLa may be performed by using a UV exposure facility, and an inclination degree of the forward tapered shape may be adjusted by adjusting a degree of exposure.

Figure 8:
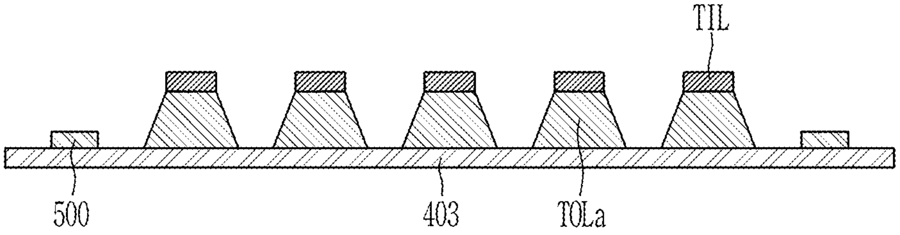

Subsequently, referring to FIG. 8, a pattern of the transparent inorganic layer TIL is formed by stacking an inorganic insulating material such as a silicon oxide ($SiO_x$) or a silicon nitride ($SiN_x$) or a transparent conductive oxide (TCO) such as an ITO or an IZO and etching it. The pattern of the transparent inorganic layer TIL overlaps the pattern of the first transparent organic layer TOLa in a plan view.

Subsequently, referring to FIG. 9, the second transparent organic layer TOLb pattern is formed by applying a transparent organic material on the transparent inorganic layer TIL and patterning a transparent organic material using the photolithography process.

The second transparent organic layer TOLb overlaps the first transparent organic layer TOLa with the transparent inorganic layer TIL provided therebetween in a plan view. As such, as the transparent inorganic layer TIL is positioned between the first and second transparent organic layers TOLa and TOLb, mixing between the first and second transparent organic layers TOLa and TOLb may be prevented, and an adhesion characteristic between the first and second transparent organic layers TOLa and TOLb may be improved. The transmission portion TOL including the first transparent organic layer TOLa, the transparent inorganic layer TIL, and the second transparent organic layer TOLb may be formed to have a second height h2 in the third direction DR3, which is the thickness direction of the substrate. For example, the second height h2 of the transmission portion TOL may be in a range of about 6 μm to about 10 μm.

Figure 9:
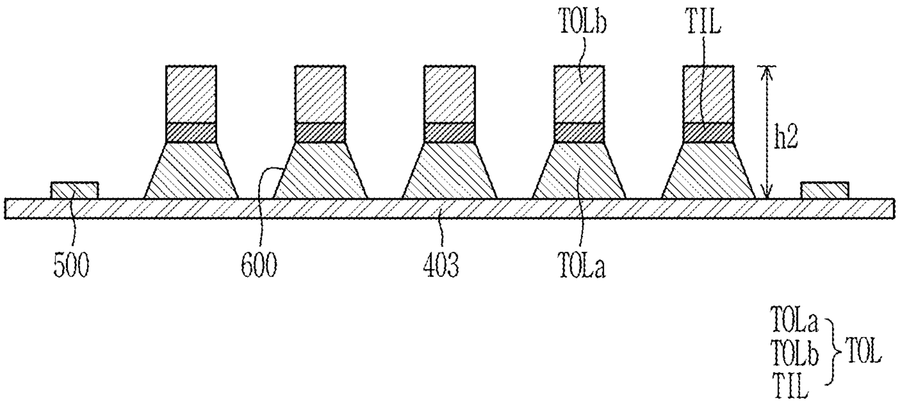

Referring to FIG. 9, an opening 600 having a reverse tapered shape is formed at a low portion between patterns of the transmission portions TOL including the first transparent organic layer TOLa having a forward tapered cross-section and the second transparent organic layer TOLb having a quadrangular cross-section, A light blocking material is applied over an entire area. The light blocking material may include a dark color pigment such as a black pigment or a gray pigment, a dark color dye, a metal such as aluminum or silver, a metal oxide, or a dark color polymer as a light absorbing material.

Figure 10:
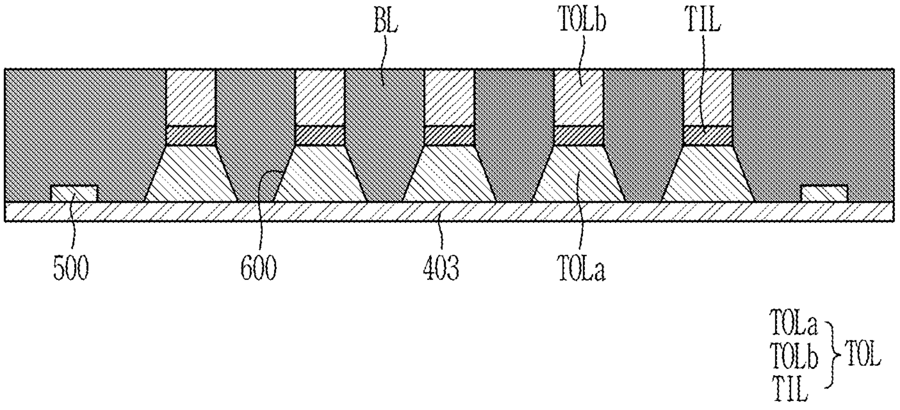

Referring to FIG. 10, a light blocking material applied to an entire area may be introduced into the opening 600 having a reverse tapered shape formed between the patterns of the transmission portions TOL to form the light blocking pattern BL corresponding to a shape of openings 600 of the transmission portions TOL.

Thereafter, upper surfaces of the light blocking patterns BL may be planarized based on the upper surface of the second transparent organic layer TOLb through the planarization process. For example, upper surfaces of the light blocking patterns BL may be planarized through a chemical mechanical polishing (CMP) process, and the upper surfaces of the light blocking patterns BL may be positioned on a same plane as an upper surface of the second transparent organic layer TOLb. Accordingly, the light blocking patterns BL may be formed to have a height in a range of about 6 μm to about 10 μm corresponding to the second height h2 of the transmission portion TOL.

Through such a process, a light blocking pattern BL including a reverse tapered shape may be formed in a lower cross-section. Since the light blocking pattern BL may include an inclined surface on a side surface, a side blocking rate may be improved by limiting a side reflection angle.

The optical density (OD) of the light blocking pattern BL may be controlled by an amount of pigment included in the light absorbing material and a thickness of the light blocking pattern BL. According to an embodiment, the optical density (OD) of the light absorbing material included in the light blocking pattern BL may be in a range of about 1.5 to about 2.0, and thus reflectance from a side surface of the light blocking pattern BL may be reduced.

Figure 11:
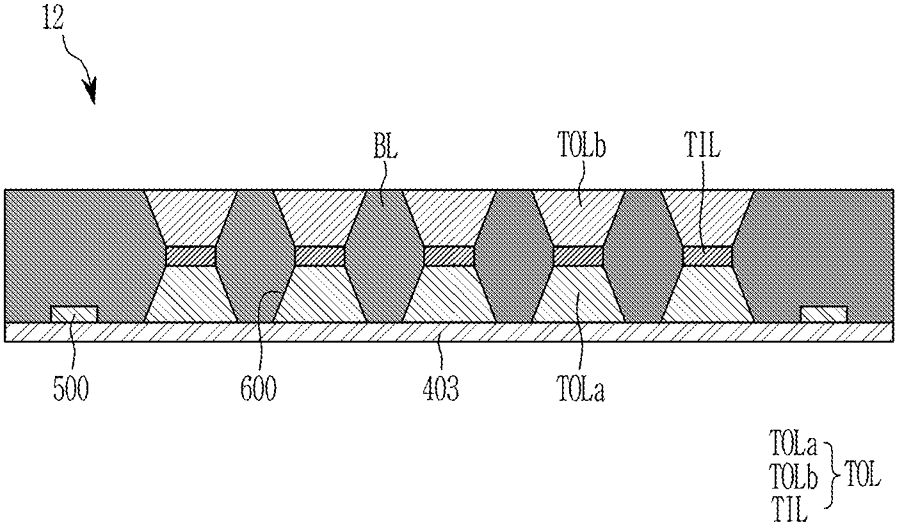
FIG. 11 illustrates a schematic cross-sectional view of a light controller formed in a display device according to an embodiment.

FIG. 11 illustrates a schematic cross-sectional view of a light controller 12 formed in a display device according to an embodiment.

Referring to FIG. 11, in the light controller 12, the first transparent organic layer TOLa having a forward tapered shape may be positioned on the upper inorganic encapsulation layer 403, the transparent inorganic layer TIL may be positioned on the first transparent organic layer TOLa, and the second transparent organic layer TOLb having a reverse tapered shape may be positioned on the transparent inorganic layer TIL. The transparent inorganic layer TIL may be positioned to contact an upper surface of the first transparent organic layer TOLa and a lower surface of the second transparent organic layer TOLb.

The light controller 12 of FIG. 11 differs from the light controller 10 of FIG. 4 in that a cross-sectional shape of the second transparent organic layer TOLb is different therefrom. Hereinafter, a detailed description of components identical to those of the previous embodiment is omitted. The omitted description of the components follows the previous embodiment.

Referring to FIG. 11, the transmission portion TOL including the first transparent organic layer TOLa having a forward tapered shape and the second transparent organic layer TOLb having a reverse tapered shape may have an hourglass shape in a schematic cross-sectional view. Since the cross-section of the transmission portion TOL has an hourglass shape, the cross-section of the opening 600 in which the transmission portions TOL are formed between the patterns may each have a diamond shape, and accordingly, the light blocking pattern BL formed in the opening 600 may have a diamond shape corresponding to the shape of the opening 600 in a schematic cross-sectional view.

As such, a lower portion of the light blocking pattern BL has a reverse taper-shaped side slope according to the forward tapered shape of the first transparent organic layer TOLa, and an upper portion of the light blocking pattern BL may have a forward-tapered side slope according to the reverse tapered shape of the second transparent organic layer TOLb. Accordingly, a reflection angle of light that is not partially absorbed and is reflected from a side surface of the light blocking pattern BL may be limited, thereby reducing a side emission angle. An emission angle will be described in detail later together with a comparative example in FIGS. 21A, 21B, 21C, and 21D.

Hereinafter, a manufacturing method of the light controller 12 according to an embodiment will be described through FIG. 12 to FIG. 15. FIG. 12 to FIG. 15 illustrate a manufacturing method of forming the light controller 12 of the display device according to an embodiment. A detailed description of a same process as the process described above will be omitted. The omitted description of the components follows the previous embodiment.

FIG. 12 to FIG. 15 illustrate some or a number of the layers positioned under or below the light controller 12, and only the upper inorganic encapsulation film 403 included in the encapsulation layer 400 is illustrated.

Figure 12:
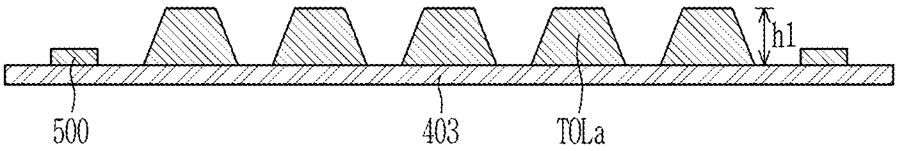
FIG. 12 to FIG. 15 sequentially illustrate a manufacturing method of forming the light controller of FIG. 11.

First, referring to FIG. 12, a pattern of the first transparent organic layer TOLa is formed by forming an align key 500 on the upper inorganic encapsulation film 403, and applying a transparent organic material thereto and patterning a transparent organic material using the photolithography process.

The first transparent organic layer TOLa may be formed to have a structure that has a constant width and extends along one direction or a direction, and may be formed with the first height h1 in the third direction DR3. For example, the first height h1 of the first transparent organic layer TOLa may be in a range of about 3 μm to about 5 μm.

The first transparent organic layer TOLa may be formed to have a forward tapered shape in which a width decreases toward the top. During the photolithography process, exposure of the first transparent organic layer TOLa may be performed by using a UV exposure facility, and an inclination degree of the forward tapered shape may be adjusted by adjusting a degree of exposure.

Figure 13:
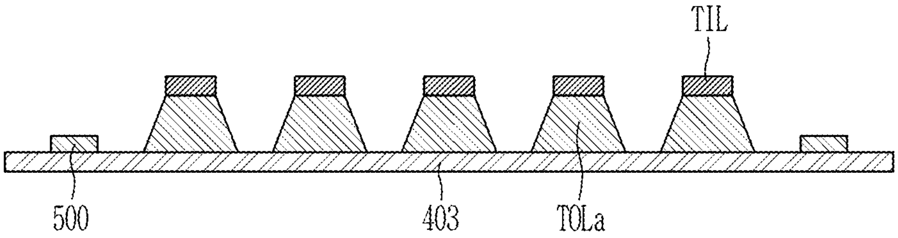

Subsequently, referring to FIG. 13, a pattern of the transparent inorganic layer TIL is formed by stacking an inorganic insulating material such as a silicon oxide ($SiO_x$) or a silicon nitride ($SiN_x$) or a transparent conductive oxide (TCO) such as an ITO or an IZO, and etching it. The pattern of the transparent inorganic layer TIL overlaps the first transparent organic layer TOLa in a plan view.

Figure 14:
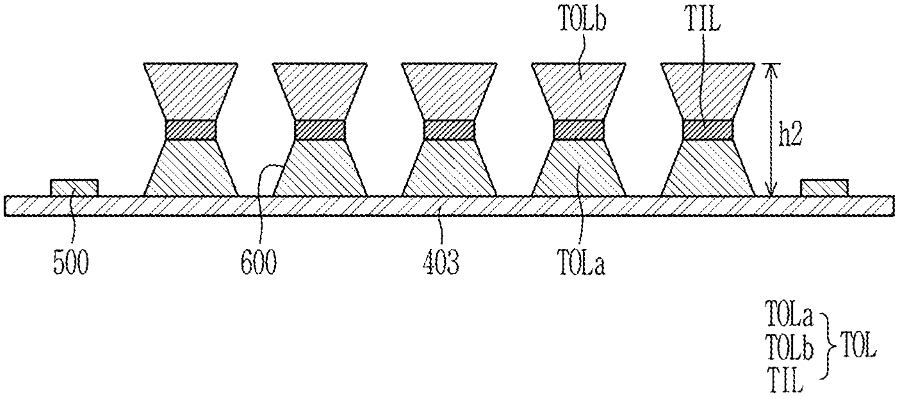

Thereafter, referring to FIG. 14, the second transparent organic layer TOLb is deposited on the transparent inorganic layer TIL, and patterned using a photolithography process. The second transparent organic layer TOLb overlaps the first transparent organic layer TOLa with the transparent inorganic layer TIL provided therebetween.

The second transparent organic layer TOLa may be formed to have a forward tapered shape in which a width increases toward the top in a schematic cross-sectional view. During the photolithography process, heat treatment of the second transparent organic layer TOLb may be performed using a post exposure bake facility, and a degree of inclination of the reverse taper shape may be adjusted by adjusting a heat treatment process condition.

The transmission portion TOL including the first transparent organic layer TOLa, the transparent inorganic layer TIL, and the second transparent organic layer TOLb may be formed to have the second height h2 in the third direction DR3. For example, the second height h2 of the transmission portion TOL may be in a range of about 6 μm to about 10 μm.

Referring to FIG. 14, an opening 600 having a diamond shape in a schematic cross-sectional view is formed between the patterns of the transmission portion TOL including the first transparent organic layer TOLa having a forward tapered shape, the transparent inorganic layer TIL on the first transparent organic layer TOLa, and the second transparent organic layer TOLb having a reverse tapered shape on the transparent inorganic layer TIL.

Figure 15:
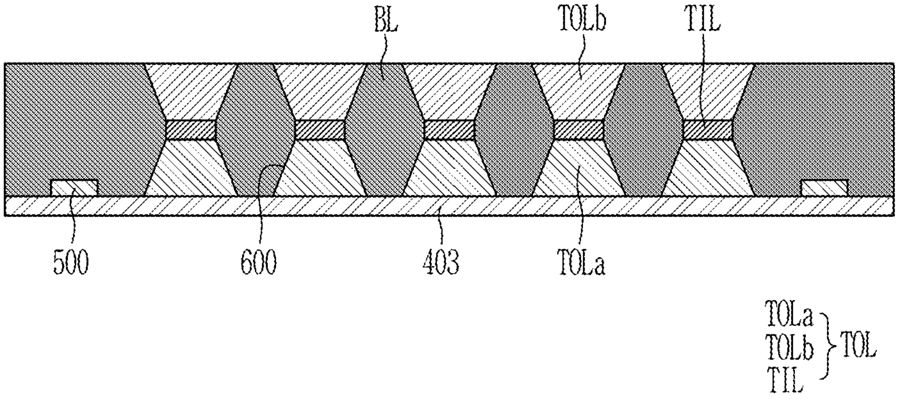

Subsequently, in FIG. 15, a light blocking material filling the opening 600 between the transmission portions TOL is applied to an entire area. A light blocking material applied to an entire area may be introduced into the opening 600 having a diamond shape formed between the patterns of the transmission portions TOL to form the light blocking pattern BL corresponding to openings 600 of the transmission portions TOL.

Thereafter, through a planarization process, a light blocking pattern BL having a reverse tapered structure at the bottom and a forward tapered structure at the top in a schematic cross-sectional view may be formed. A cross-section of the light blocking pattern BL may have a diamond shape corresponding to the openings 600 of the transmission portions TOL.

Since the light blocking pattern BL may include an inclined surface on a side surface, a side blocking rate may be improved by limiting a side reflection angle.

The optical density (OD) of the light blocking pattern BL may be controlled by an amount of pigment and a thickness of the light blocking pattern BL. According to an embodiment, the optical density (OD) of the light absorbing material included in the light blocking pattern BL may be in a range of about 1.5 to about 2.0, and thus reflectance from a side surface of the light blocking pattern BL may be reduced.

Figure 16:
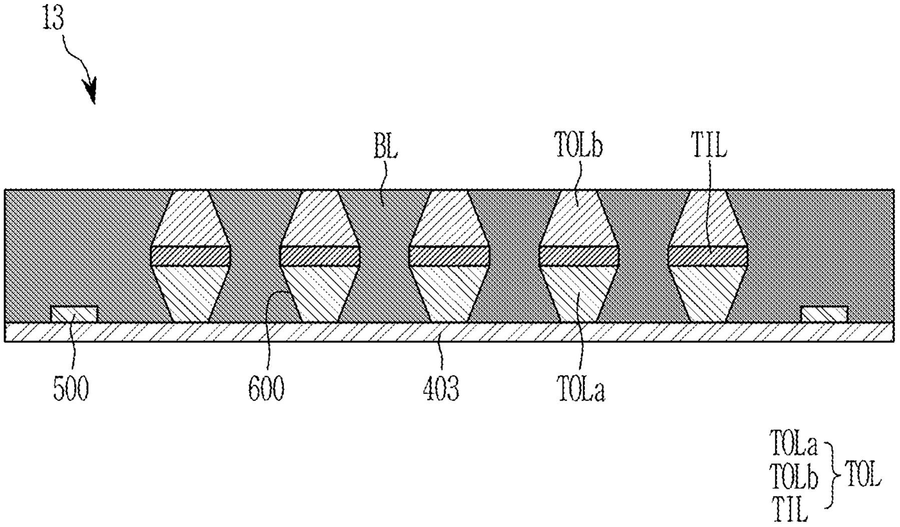
FIG. 16 illustrates a schematic cross-sectional view of a light controller formed in a display device according to an embodiment.

FIG. 16 illustrates a schematic cross-sectional view of a light controller 13 formed in a display device according to an embodiment.

Referring to FIG. 16, in the light controller 13, the first transparent organic layer TOLa having a reverse tapered shape may be positioned on the upper inorganic encapsulation layer 403, the transparent inorganic layer TIL may be positioned on the first transparent organic layer TOLa, and the second transparent organic layer TOLb having a forward tapered shape may be positioned on the transparent inorganic layer TIL. The transmission portion TOL including the first transparent organic layer TOLa, the transparent inorganic layer TIL, and the second transparent organic layer TOLb may be formed to have a diamond shape in a schematic cross-sectional view. The transparent inorganic layer TIL may be positioned to contact an upper surface of the first transparent organic layer TOLa and a lower surface of the second transparent organic layer TOLb.

Light blocking patterns BL may be formed to fill the openings 600 formed between the patterns of the transmission portions TOL. Since the cross-section of the transmission portion TOL has a diamond shape, the cross-section of the opening 600 in which the transmission portions TOL are formed between the patterns may each have an hourglass shape, and accordingly, the light blocking pattern BL formed in the opening 600 may have an hourglass shape corresponding to the shape of the opening 600 in a schematic cross-sectional view.

As such, a lower portion of the light blocking pattern BL has a forward taper-shaped side slope according to the reverse tapered shape of the first transparent organic layer TOLa, and an upper portion of the light blocking pattern BL may have a reverse-tapered side slope according to the forward tapered shape of the second transparent organic layer TOLb. Accordingly, a reflection angle of light that is not partially absorbed and is reflected from a side surface of the light blocking pattern BL may be limited, thereby reducing a side emission angle. An emission angle will be described in detail later together with a comparative example in FIGS. 21A, 21B, 21C, and 21D.

Hereinafter, a manufacturing method of the light controller 13 according to an embodiment will be described through FIG. 17 to FIG. 20. FIG. 17 to FIG. 20 illustrate a manufacturing method of forming the light controller 13 of the display device according to an embodiment. A detailed description of a same process as the process described above will be omitted. The omitted description of the components follows the previous embodiment.

Figure 17:
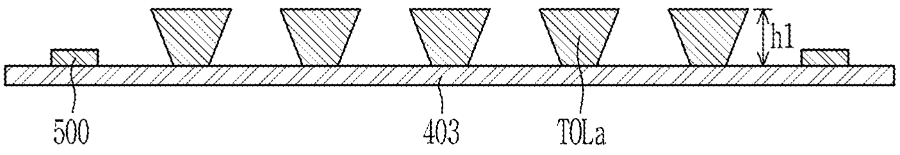
FIG. 17 to FIG. 20 sequentially illustrate a manufacturing method of forming the light controller of FIG. 16.

First, referring to FIG. 17, a pattern of the first transparent organic layer TOLa is formed by forming an align key 500 on the upper inorganic encapsulation film 403, and applying a transparent organic material thereto and patterning a transparent organic material using the photolithography process.

The first transparent organic layer TOLa may be formed to have a structure that has a constant width and extends along one direction or a direction, and may be formed with the first height h1 in the third direction DR3. For example, the first height h1 of the first transparent organic layer TOLa may be in a range of about 3 μm to about 5 μm.

The first transparent organic layer TOLa may be formed to have a forward tapered shape in which a width increases toward the top in a schematic cross-sectional view. During the photolithography process, heat treatment may be performed using a post exposure bake facility, and a degree of inclination of the reverse taper shape may be adjusted by adjusting a heat treatment process condition.

Figure 18:
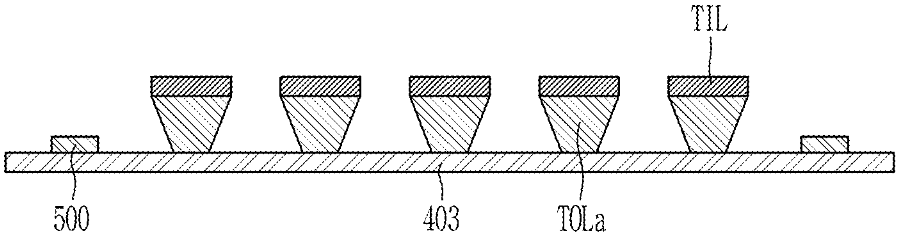

Subsequently, referring to FIG. 18, a pattern of the transparent inorganic layer TIL is formed by stacking an inorganic insulating material such as a silicon oxide ($SiO_x$) or a silicon nitride ($SiN_x$) or a transparent conductive oxide (TCO) such as an ITO or an IZO, and etching it. The pattern of the transparent inorganic layer TIL overlaps the first transparent organic layer TOLa in a plan view.

Subsequently, referring to FIG. 19, the second transparent organic layer TOLb pattern is formed by applying a transparent organic material on the transparent inorganic layer TIL and patterning a transparent organic material using the photolithography process.

The second transparent organic layer TOLb may be formed to have a forward tapered shape in which a width decreases toward the top in a schematic cross-sectional view. During the photolithography process, additional exposure may be performed by using a UV exposure facility, and an inclination degree of the forward tapered shape may be adjusted by adjusting a degree of additional exposure.

The transmission portion TOL including the first transparent organic layer TOLa, the transparent inorganic layer TIL, and the second transparent organic layer TOLb may be formed to have the second height h2 in the third direction DR3. For example, the second height h2 of the transmission portion TOL may be in a range of about 6 μm to about 10 μm.

Figure 19:
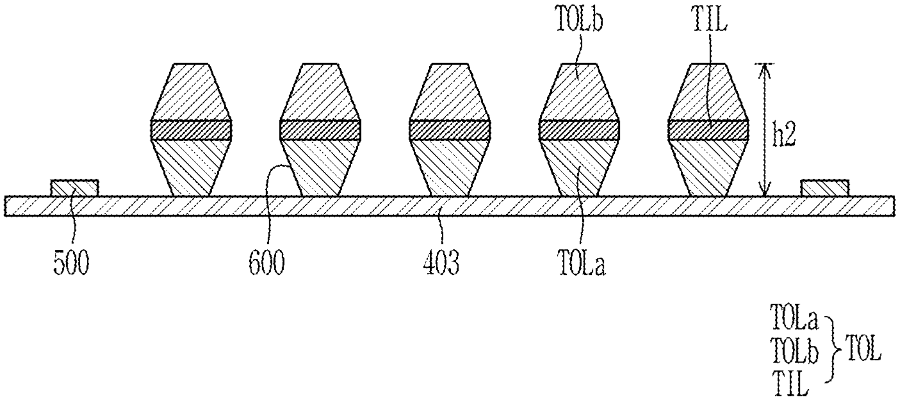

Referring to FIG. 19, an opening 600 having an hourglass shape in a schematic cross-sectional view is formed between the patterns of the transmission portion TOL including the first transparent organic layer TOLa having a reverse tapered shape, the transparent inorganic layer TIL on the first transparent organic layer TOLa and the second transparent organic layer TOLb having a forward tapered shape on the transparent inorganic layer TIL.

Figure 20:
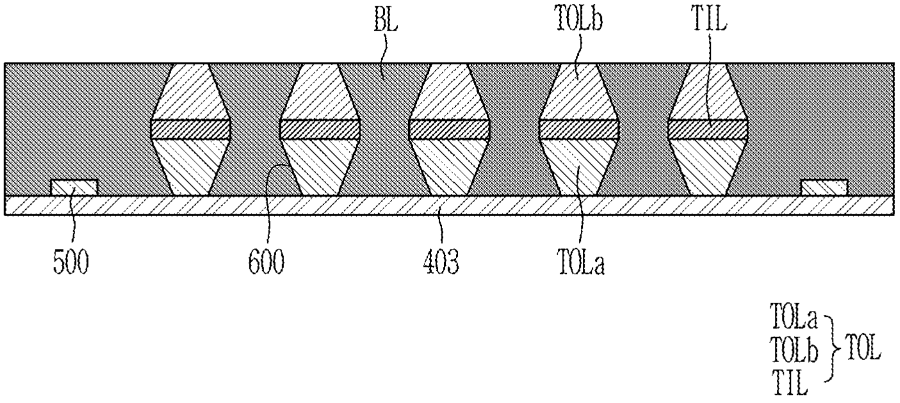

Subsequently, in FIG. 20, a light blocking material filling the opening 600 between the transmission portions TOL is applied to an entire area. A light blocking material applied to an entire area may be introduced into the opening 600 having an hourglass shape formed between the patterns of the transmission portions TOL to form the light blocking pattern BL corresponding to openings 600 of the transmission portions TOL.

Thereafter, through a planarization process, a light blocking pattern BL having a forward tapered structure at the bottom and a reverse tapered structure at the top in a schematic cross-sectional view may be formed. A cross-section of the light blocking pattern BL may have an hourglass shape corresponding to the openings 600 of the transmission portions TOL.

Since the light blocking pattern BL may include an inclined surface on a side surface, a side blocking rate may be improved by limiting a side reflection angle.

The optical density (OD) of the light blocking pattern BL may be controlled by an amount of pigment and a thickness of the light blocking pattern BL. According to an embodiment, the optical density (OD) of the light absorbing material included in the light blocking pattern BL may be in a range of about 1.5 to about 2.0, and thus reflectance from a side surface of the light blocking pattern BL may be reduced.

FIGS. 21A, 21B, 21C, and 21D illustrates a light emission simulation diagram of comparative examples and examples.

Figure 21A:
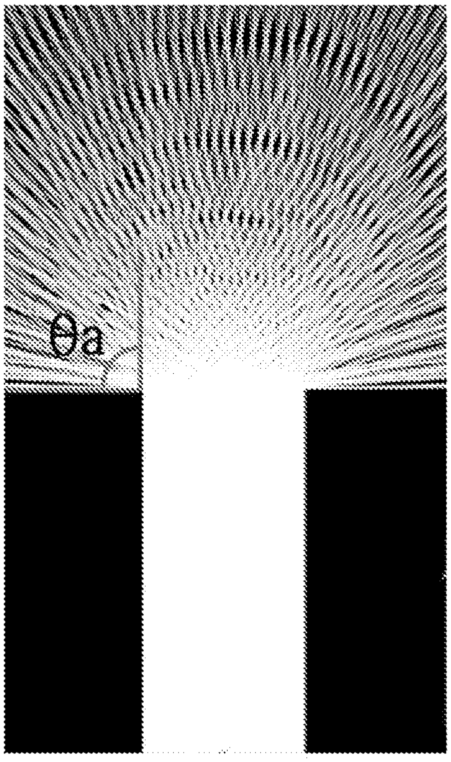
FIGS. 21A, 21B, 21C, and 21D illustrate a light emission simulation diagram of comparative examples and examples.
Figure 21B:
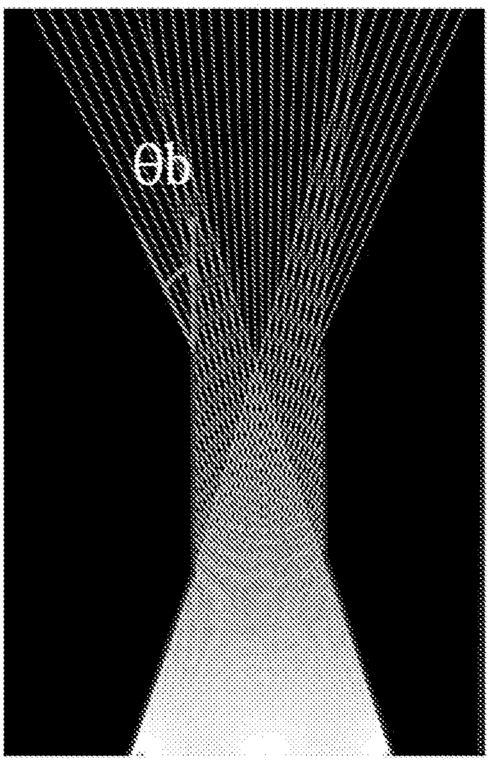
Figure 21C:
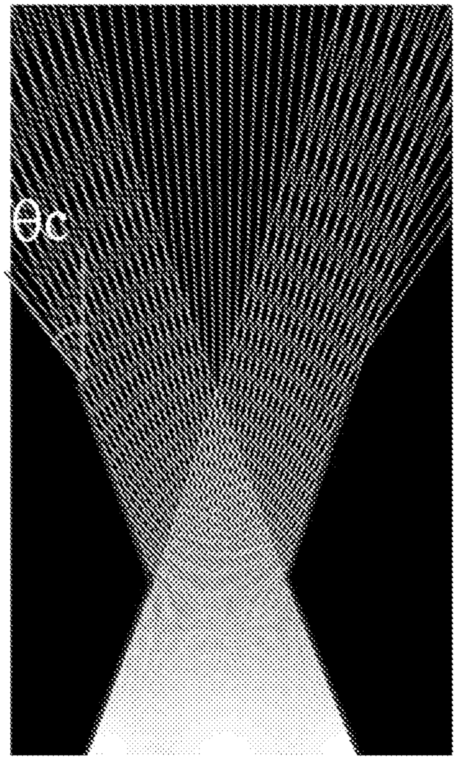
Figure 21D:
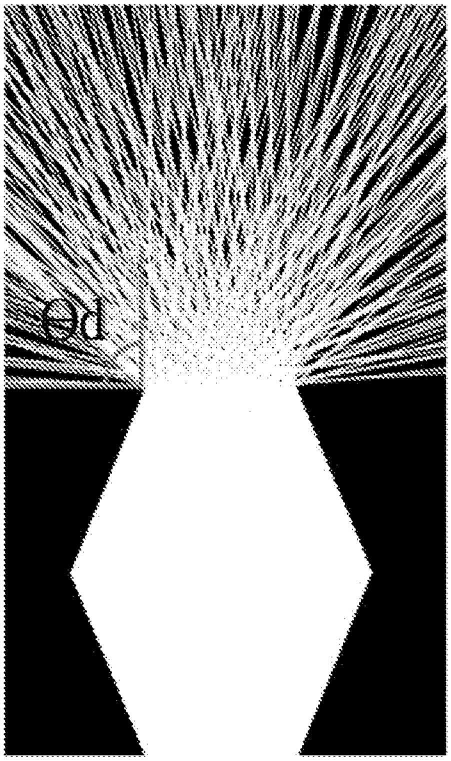

FIG. 21A illustrates an emission simulation diagram according to a comparative example, FIG. 21B illustrates an emission simulation diagram according to an embodiment of FIG. 4, FIG. 21C illustrates an emission simulation diagram according to an embodiment of FIG. 11, and FIG. 21D illustrates an output simulation diagram according to an embodiment of FIG. 16.

It can be seen that comparing the comparative example of FIG. 21A with the examples of FIG. 21B, FIG. 21C and FIG. 21D, a side emission angle θb according to an embodiment of FIG. 21B and a side emission angle θc according to an embodiment of FIG. 21C are smaller than a side emission angle θa according to the comparative example of FIG. 21A.

In fact, according to simulation results, it is confirmed that the side emission angle θa depending on the comparative example is about 90 degrees, the side emission angle θb depending on embodiment of FIG. 21B is about 25 degrees, and the side emission angle θc depending on an embodiment of FIG. 21C is about 35 degrees. Side emission angle θd depending on an embodiment of FIG. 21D has a slight difference from the side emission angle θa depending on the comparative example, but the amount of light transferred to a side surface is less than that of the comparative example.

As such, since the side viewing angles θb, θc, and θd of the display device according to the examples are narrower than the side viewing angle θa of the display device according to the comparative example, or the side emission amounts thereof are smaller than that of the comparative example, a side blocking rate of the display device may be improved.

Figure 22:
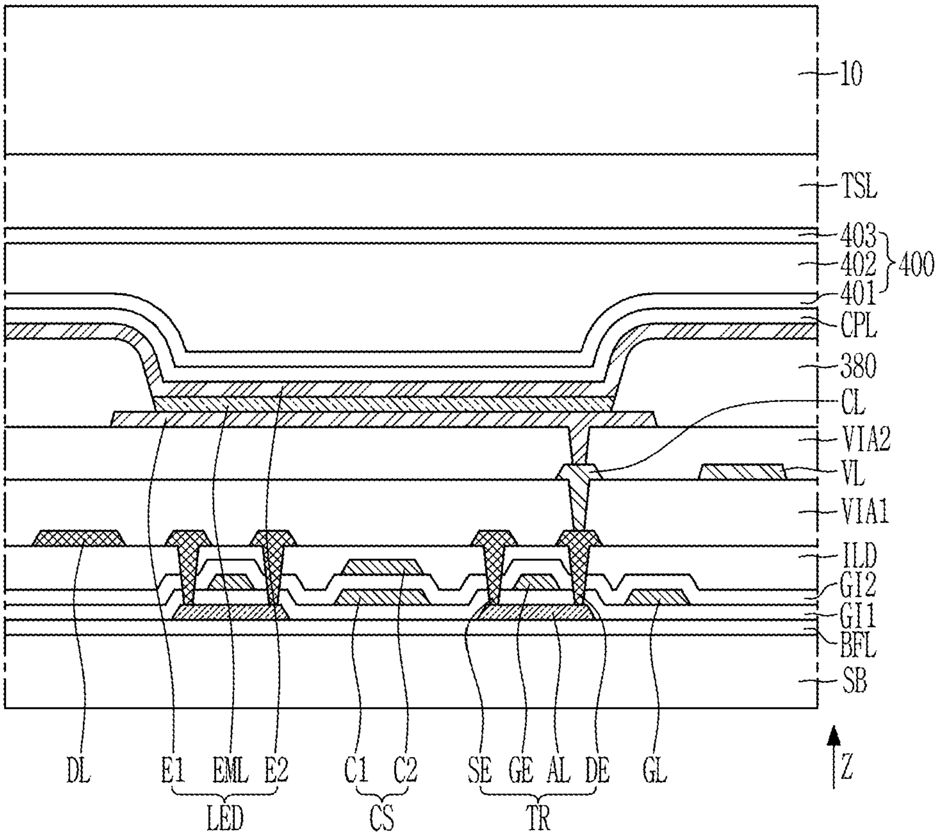
FIG. 22 illustrates a schematic cross-sectional view of a display panel according to an embodiment.

Hereinafter, a structure of the light emitting element positioned under or below the light controller 10 will be described with reference to FIG. 22. FIG. 22 illustrates a schematic cross-sectional view showing a stacked structure of a display panel according to an embodiment.

The display panel basically may include a substrate SB, a transistor TR formed on the substrate SB, and a light emitting element connected to the transistor TR. The light emitting element LED may correspond to the pixel.

The substrate SB may be made of a material such as glass. The substrate SB may be a flexible substrate including a polymer resin such as polyimide, polyamide, or polyethylene terephthalate.

A buffer layer BFL may be disposed on the substrate SB. The buffer layer BFL may improve the characteristics of the semiconductor layer by blocking impurities from the substrate SB in case that the semiconductor layer is formed, and may flatten a surface of the substrate SB to relieve a stress of the semiconductor layer. The buffer layer BFL may include an inorganic insulating material such as a silicon nitride ($SiN_x$), a silicon oxide ($SiO_x$), or a silicon oxynitride ($SiO_xN_y$), and may be a single layer or multiple layers. The buffer layer BFL may include amorphous silicon (Si).

A semiconductor layer AL of a transistor TR may be disposed on the buffer layer BFL. The semiconductor layer AL may include a first region and a second region, and a channel region therebetween. The semiconductor layer AL may include any one of amorphous silicon, polysilicon, and an oxide semiconductor. For example, the semiconductor layer AL may include low temperature polysilicon (LTPS), and may include an oxide semiconductor material including at least one of zinc (Zn), indium (In), gallium (Ga), and tin (Sn). For example, the semiconductor layer AL may include an indium-gallium-zinc oxide (IGZO).

A first gate insulating layer GI1 may be disposed on the semiconductor layer AL. The first gate insulating layer GI1 may include an inorganic insulating material such as a silicon nitride, a silicon oxide, and a silicon oxynitride, and may be a single layer or multiple layers. The first gate conductive layer, which may include a gate electrode GE of the transistor TR, a gate line GL, and a first electrode C1 of a capacitor CS, may be disposed on the first gate insulating layer GI1. The first gate conductive layer may include molybdenum (Mo), aluminum (Al), copper (Cu), titanium (Ti), and the like, and may be a single layer or multiple layers.

A second gate insulating layer GI2 may be disposed on the first gate conductive layer. The second gate insulating layer GI2 may include an inorganic insulating material such as a silicon nitride, a silicon oxide, and a silicon oxynitride, and may be a single layer or multiple layers.

A second gate conductive layer that may include a second electrode C2 of the capacitor CS and the like may be disposed on the second gate insulating layer GI2. The second gate conductive layer may include molybdenum (Mo), aluminum (Al), copper (Cu), titanium (Ti), and the like, and may be a single layer or multiple layers.

An interlayer insulating layer ILD may be disposed on the second gate insulating layer GI2 and the second gate conductive layer. The interlayer insulating layer ILD may include an inorganic insulating material such as a silicon nitride, a silicon oxide, and a silicon oxynitride, and may be a single layer or multiple layers.

A first data conductive layer that may include a first electrode SE and a second electrode DE, a data line DL, and the like of the transistor TR may be disposed on the interlayer insulating layer ILD. The first electrode SE and the second electrode DE may be respectively connected to a first region and a second region of the semiconductor layer AL through contact holes of the insulating layers GI1, GI2, and ILD. One of the first electrode SE and the second electrode DE may serve as a source electrode, and the other may serve as a drain electrode. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A first planarization layer VIA1 may be disposed on the first data conductive layer. The first planarization layer VIA1 may be an organic insulating layer. For example, the first planarization layer VIA1 may contain poly(methyl methacrylate), a general purpose polymer such as polystyrene, a polymer derivative having a phenolic group, an acrylic polymer, an imide-based polymer, polyimide, and an organic insulating material such as a siloxane-based polymer.

A second data conductive layer, which may include a voltage line VL, a connection line CL, and the like, may be disposed on the first planarization layer VIA1. The voltage line VL may transfer voltages such as a driving voltage, a common voltage, an initialization voltage, and a reference voltage. The connection line CL may be connected to the second electrode DE of the transistor TR through a contact hole of the first planarization layer VIA1. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A second planarization layer VIA2 may be disposed on the second data conductive layer. The second planarization layer VIA2 may be an organic insulating layer. For example, the second planarization layer VIA2 may contain poly (methyl methacrylate), a general purpose polymer such as polystyrene, a polymer derivative having a phenolic group, an acrylic polymer, an imide-based polymer, polyimide, and an organic insulating material such as a siloxane-based polymer.

A first electrode E1 of the light emitting element is disposed on the second planarization layer VIA2. The first electrode E1 may be connected to the connection line CL through a contact hole formed in the second planarization layer VIA2. Accordingly, the first electrode E1 may be electrically connected to the second electrode DE of the transistor TR to receive a data signal for controlling luminance of the light emitting element. The transistor TR to which the first electrode E1 is connected may be a driving transistor or a transistor that is electrically connected to the driving transistor. The first electrode E1 may be formed of a reflective conductive material or a translucent conductive material, or may be formed of a transparent conductive material. The first electrode E1 may include a transparent conductive material such as an indium tin oxide (ITO) or an indium zinc oxide (IZO). The first electrode E1 may include a metal such as lithium (Li), calcium (Ca), aluminum (Al), silver (Ag), magnesium (Mg), or gold (Au), or a metal alloy thereof.

A pixel definition layer 380, which may be an organic insulating layer, may be disposed on the second planarization layer VIA2. The pixel definition layer 380 may be referred to as a partition wall, and may have an opening overlapping the first electrode E1.

An emission layer EML of the light emitting diode LED may be disposed on the first electrode E1. In addition to the emission layer EML, at least one of a hole injection layer, a hole transport layer, an electron transport layer, and an electron injection layer may be disposed on the first electrode E1.

A second electrode E2 of the light emitting diode LED is disposed on the emission layer EML. The second electrode E2 may be made of a low work function metal such as calcium (Ca), barium (Ba), magnesium (Mg), aluminum (Al), silver (Ag), or a metal alloy thereof, as a thin layer to have light transmittance. The second electrode E2 may include a transparent conductive oxide such as an indium tin oxide (ITO) or an indium zinc oxide (IZO).

The first electrode E1, the emission layer EML, and the second electrode E2 of each pixel may constitute a light emitting diode LED, such as an organic light emitting element. The first electrode E1 may be an anode of the light emitting element, and the second electrode E2 may be a cathode of the light emitting element.

A capping layer CPL may be disposed on the second electrode E2. The capping CPL may increase light efficiency by adjusting a refractive index. The capping layer CPL may be disposed to entirely cover the second electrode E2. The capping layer CPL may include an organic insulating material, or may include an inorganic insulating material.

An encapsulation layer 400 may be disposed on the capping layer CPL. The encapsulation layer 400 may encapsulate a light emitting element LED to prevent moisture or oxygen from penetrating from the outside. The encapsulation layer 400 may be a thin film encapsulation layer including one or more inorganic encapsulation films 401 and 403 and one or more organic encapsulation films 402.

A touch sensor layer TSL including touch electrodes may be disposed on the encapsulation layer 400. The touch electrodes may have a mesh shape having an opening overlapping the light emitting element LED.

The light controller 10 may be positioned on the touch sensor layer TSL. A cover window for protecting an entire front surface of the display panel may be positioned above the light controller 10.

A passivation film may be disposed to protect the display panel below the substrate SB. A functional sheet including at least one of a cushion layer, a heat dissipation sheet, a light blocking sheet, a waterproof tape, and an electromagnetic barrier layer may be positioned under or below the protection film.

Light emitted from the emission layer EML of the display panel may pass through the light controller 10 and the cover window to be recognized by a user. Light emitted upward or downward at a selectable angle or more with respect to a direction perpendicular to the cover window may be blocked by the light blocking patterns BL included in the light controller 10. Since the light controller 10 according to an embodiment may include an inclined surface having a tapered side surface, light reflectance of the side surface may be improved. Various modifications as described in FIG. 1 to FIGS. 21A, 21B, 21C, and 21D may be applied to the light blocking patterns BL constituting the light controller 10.

Hereinafter, various effects of the display device including a light controller according to an embodiment will be described with reference to FIG. 23 to FIG. 25.

Figure 23:
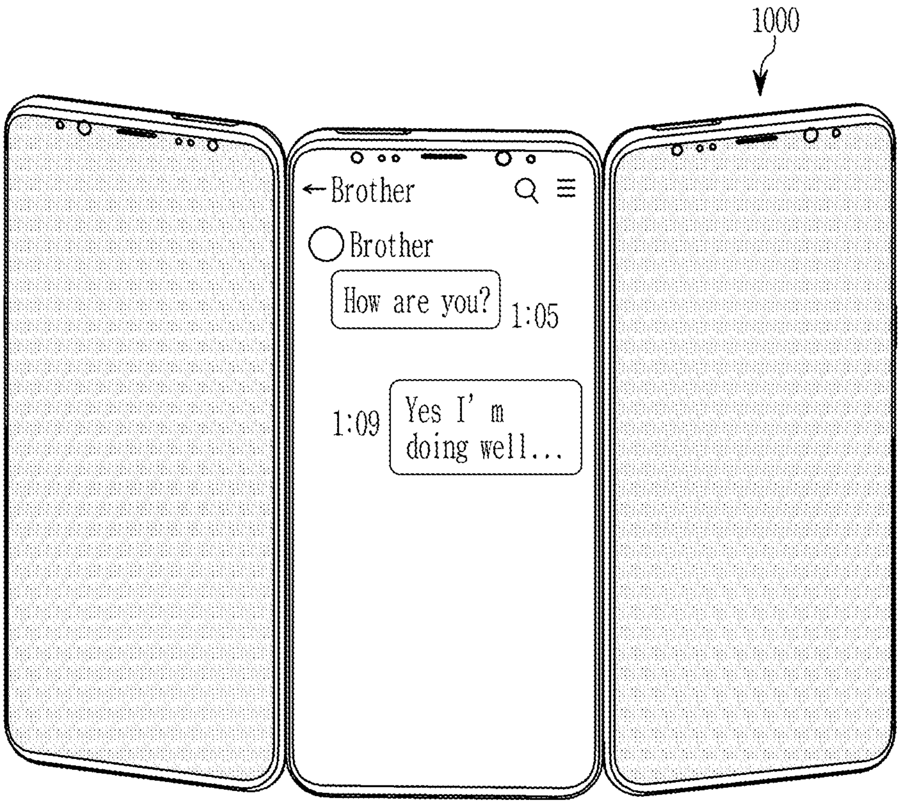
FIG. 23 illustrates a display device as viewed from various angles according to an embodiment.

FIG. 23 illustrates a display device as viewed from various angles according to an embodiment.

Referring to FIG. 23, the display device 1000 according to an embodiment displays an image to a user in a direction facing the user, and the image may not be viewed at a given angle or higher. Accordingly, it is possible to provide a privacy protection function to protect information displayed on the screen from people around in a public place.

Figure 24:
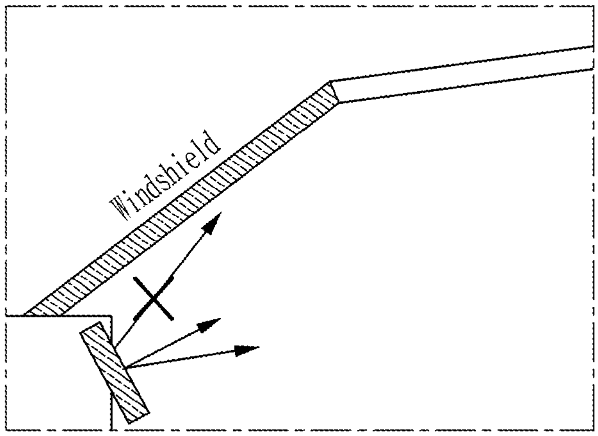
FIG. 24 illustrates a path of light emitted from a display device according to an example.
Figure 25:
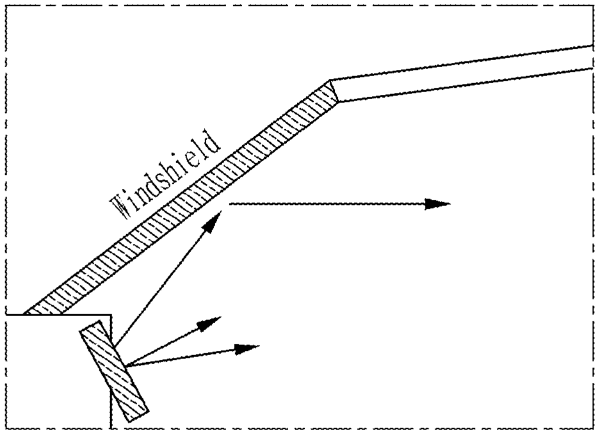
FIG. 25 illustrates a path of light emitted from a display device according to a comparative example

FIG. 24 and FIG. 25 illustrate cases in which a display device is applied to a vehicle according to an embodiment. FIG. 24 illustrates a path of light emitted from a display device according to an example, and FIG. 25 illustrates a path of light emitted from a display device according to a comparative example.

Referring to FIG. 24, in the case of a display device including a light controller, light emitted toward a vehicle window (for example, a windshield) may be blocked within the display device. Accordingly, light emitted from the display device may be prevented from being reflected on the windshield for a vehicle. It is possible to prevent reflection images from occurring and to secure the driver's safety by blocking the light directed to the windshield for a vehicle.

Referring to FIG. 25, in the case of a display device that does not include a light controller, as light emitted from the display device is emitted at various angles, some of the light may be emitted toward the windshield for a vehicle to be recognized as a reflected image by a user.

While this disclosure has been described in connection with what is considered to be practical embodiments, it is to be understood that the disclosure is not limited to the disclosed embodiments, but, on the contrary, is intended to cover various modifications and equivalent arrangements included within the spirit and the scope of the appended claims.

What is claimed is:

1. A display device comprising:
- a light emitting element disposed on a substrate and including an emission layer; and
- a light controller disposed over the light emitting element, wherein the light controller includes:
  - light blocking patterns to extend in a first direction and spaced apart in a second direction intersecting the first direction; and
  - a transmission portion disposed between the light blocking patterns to extend in the first direction, and the transmission portion includes:
  - a first transparent organic layer;
  - a transparent inorganic layer disposed on the first transparent organic layer; and
  - a second transparent organic layer disposed on the transparent inorganic layer.

2. The display device of claim 1, wherein
- a cross-section of the first transparent organic layer has a substantially forward tapered shape.

3. The display device of claim 2, wherein
- the second transparent organic layer has a substantially quadrangular or a substantially reverse tapered cross-section.

4. The display device of claim 1, wherein
- a cross-section of the first transparent organic layer has a substantially reverse tapered shape, and a cross-section of the second transparent organic layer has a substantially forward tapered shape.

5. The display device of claim 1, wherein the transparent inorganic layer contacts an upper surface of the first transparent organic layer and a lower surface of the second transparent organic layer.

6. The display device of claim 1, wherein the light blocking patterns have a substantially reverse tapered lower cross-section.

7. The display device of claim 1, wherein the light blocking patterns have a substantially diamond or substantially hourglass shape in a cross-sectional view.

8. The display device of claim 1, wherein the first transparent organic layer has a height in a range of about 3 μm to about 5 μm in a thickness direction of the substrate.

9. The display device of claim 1, wherein the transmission portion has a height in a range of about 6 μm to about 10 μm in a thickness direction of the substrate.

10. The display device of claim 1, wherein the light blocking patterns include a light absorbing material having an optical density in a range of 1.5 to about 2.0.

* * * * *